United States Patent [19]

Yamazaki et al.

[11] Patent Number: 5,700,713
[45] Date of Patent: Dec. 23, 1997

[54] LIGHT EMITTING SEMICONDUCTOR DEVICE USING GROUP III NITRIDE COMPOUND AND METHOD OF PRODUCING THE SAME

[75] Inventors: Shiro Yamazaki; Naoki Shibata; Masayoshi Koike, all of Aichi-ken, Japan

[73] Assignee: Toyoda Gosei Co., Ltd., Nishikasugai-gun, Japan

[21] Appl. No.: 406,415

[22] Filed: Mar. 20, 1995

[30] Foreign Application Priority Data

Mar. 22, 1994 [JP] Japan ................................. 6-076513

[51] Int. Cl.$^6$ ................................................... H01L 21/20
[52] U.S. Cl. ..................... 437/129; 437/127; 148/DIG. 99
[58] Field of Search ......................... 437/905, 127, 437/128, 129; 148/DIG. 99; 257/103

[56] References Cited

U.S. PATENT DOCUMENTS

| | | | |
|---|---|---|---|
| 5,205,905 | 4/1993 | Kotaki et al. | 156/643 |
| 5,247,533 | 9/1993 | Okazaki et al. | |
| 5,272,108 | 12/1993 | Kozawa | 437/127 |
| 5,273,933 | 12/1993 | Hatano et al. | 437/129 |
| 5,281,830 | 1/1994 | Kotaki et al. | 257/86 |
| 5,306,662 | 4/1994 | Nakamura et al. | 437/107 |
| 5,369,289 | 11/1994 | Tamaki et al. | 257/103 |
| 5,432,808 | 7/1995 | Hatano et al. | 372/45 |

*Primary Examiner*—Kevin Picardat
*Attorney, Agent, or Firm*—Cushman, Darby & Cushman IP Group of Pillsbury Madison & Sutro LLP

[57] ABSTRACT

A light-emitting semiconductor device a sapphire substrate (1), an AlN buffer layer (2), a silicon (Si) doped GaN n$^+$-layer (3) of high carrier (n-type) concentration, a Si-doped $(Al_{x2}Ga_{1-x2})_{y2}In_{1-y2}N$ n$^+$-layer (4) of high carrier (n-type) concentration, a zinc (Zn) and Mg doped $((Al_{x1}Ga_{1-x1})_{y2}In_{1-y2}N$ n$^+$-layer (5), and a Mg doped $(Al_{x2}Ga_{1-x2})_{y2}In_{1-y2}N$ n$^+$-layer (6). The AlN layer (2) has a 500 Å thickness. The GaN n$^+$-layer (3) has about a 2.0 µm thickness and a $2\times10^{18}/cm^3$ electron concentration. The n$^+$-layer (4) has about a 2.0 µm thickness and a $2\times10^{18}/cm^3$ electron concentration. A double i-layer structure includes the emission layer (5) and the i-layer (6). The emission layer (5) has about a 0.5 µm thickness, and the i-layer (6) has about a 0.5 µm thickness. Parts of the emission layer (5) and the i-layer (6) are p-type regions (50, 60). Both of the p-type regions exhibit p-type conduction with a $2\times10^{17}/cm^3$ hole concentration. The emission layer (5) and the i-layer (6), except for the p-type region, exhibit semi-insulative characteristics.

10 Claims, 11 Drawing Sheets

LIGHT EMITTING SEMICONDUCTOR DEVICE USING GROUP III NITRIDE COMPOUND AND METHOD OF PRODUCING THE SAME

BACKGROUND OF THE INVENTION

1. Field of the Invention

The present invention relates to a light-emitting semiconductor device that emits blue light and uses a group III nitride compound.

2. Description of the Prior Art

It has been known that a gallium nitride (GaN) compound semiconductor with a p-n junction may be used to obtain a light-emitting diode (LED) which emits blue light. This semiconductor device is useful because of its high luminous efficiency resulting from direct electron transition and because of its ability to emit blue light, which is one of the three primary colors.

A p-type layer of the semiconductor device with a p-n junction is obtained by irradiating electrons beam to a GaN layer that is doped with magnesium (Mg) as an impurity.

There exists, however, a problem in the luminous efficiency of the above device. Since the LED has a p-n junction, forming two electrodes on the p-layer requires a process of forming a groove on the p-layer for insulating the two electrodes. This process employs reactive ion etching (RIE) which damages the interface of the p-n junction. The damaged interface of the p-n junction is a cause of a recombination current which does not contributes to light emission when a forward current is supplied through the p-n junction resulting in deteriorating luminous efficiency of the LED.

SUMMARY OF THE INVENTION

It is an object of the present invention to solve the problem and improve the luminous intensity of the LED with AlGaInN semiconductor.

According to the first aspect of the invention, there is provided a light-emitting semiconductor device comprising:

an n-layer of group III nitride compound semiconductor satisfying the formula $Al_xGa_yIn_{1-x-y}N$, inclusive of $x=0$, $y=0$ and $x=y=0$;

an i-layer of semi-insulating group III nitride compound semiconductor satisfying the formula $Al_xGa_yIn_{1-x-y}N$, inclusive of $x=0$, $y=0$, and $x=y=0$ formed on the n-layer;

an insulating film formed on said i-layer covering said i-layer except for a region which is then processed to have p-type conduction; and wherein the region comes to have p-type conduction by annealing the whole device in a nitrogen atmosphere.

According to the second aspect of the invention, there is provided a method of producing a light-emitting semiconductor device comprising the steps of;

growing an n-layer of n-type group III nitride compound semiconductor satisfying the formula $Al_xGa_yIn_{1-x-y}N$, inclusive of $x=0$, $y=0$ and $x=y=0$;

growing an i-layer of semi-insulating group III nitride compound semiconductor satisfying the formula $Al_xGa_yIn_{1-x-y}N$, inclusive of $x=0$, $y=0$ and $x=y=0$ on said n-layer;

covering the i-layer with an insulating film except a region which is to be processed to have p-type conduction; and annealing the whole device in a nitrogen atmosphere so that the region is changed to have p-type conduction.

According to the third aspect of the invention, the i-layer comprises two layers having p-type regions partially processed to have p-type conduction and one of the layers of the double i-layer structure formed on the n-layer is an emission layer having an emission region with a luminous center.

According to the fourth aspect of the invention, the emission layer is doped with magnesium (Mg) and zinc (Zn), and the i-layer formed on the emission layer is doped with magnesium (Mg).

According to the fifth aspect of the invention, the emission layer with the emission region is doped with silicon (Si) and zinc (Zn), silicon (Si) and cadmium (Cd), or silicon (Si) and magnesium (Mg).

In order to form the p-type region among the i-layer partially, the insulative film is laminated on the surface of the i-layer except for an area or part where the p-type region is formed. Then, the p-type region with p-type conduction is formed by being heated and cooled down in a nitrogen atmosphere. Since the so-obtained p-type region is surrounded by the semi-insulating i-layer, it is electrically insulated from the electrode for the n-layer. Therefore, the prior art process of forming a groove becomes unnecessary, and nothing damages the interface between the p-n junction. As a result, the luminous intensity of the LED with an undamaged p-n junction is improved. Further, the manufacturing process of the LED is simplified, because the process of forming a groove becomes unnecessary.

Other objects, features, and characteristics of the present invention will become apparent upon consideration of the following description in the appended claims with reference to the accompanying drawings, all of which form a part of the specification, and wherein referenced numerals designate corresponding parts in the various figures.

DETAILED DESCRIPTION OF THE PREFERRED EMBODIMENT

The invention will be more fully understood by reference to the following examples.

EXAMPLE 1

Figure 1:
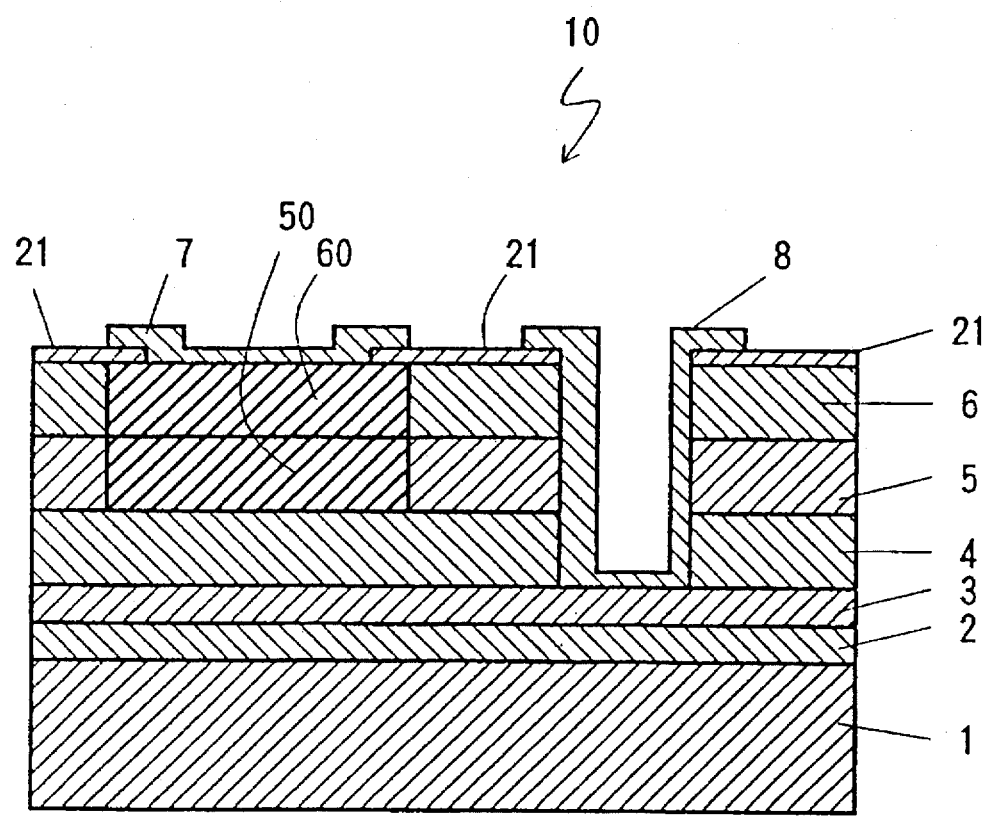
FIG. 1 is a diagram showing the structure of the LED embodied in Example 1.

FIG. 1 shows a LED 10 embodied in Example 1. It has a sapphire ($Al_2O_3$) substrate 1 upon which the following five layers are consecutively formed: an AlN buffer layer 2; a silicon (Si) doped GaN $n^+$-layer 3 of high carrier (n-type) concentration; a Si-doped $(Al_{x2}Ga_{1-x2})_{y2}In_{1-y2}N$ $n^+$-layer 4 of high carrier (n-type) concentration; a zinc (Zn) and magnesium (Mg) doped $(Al_{x1}Ga_{1-x1})_{y1}In_{1-y1}N$ emission layer 5; and a Mg doped $(Al_{x2}Ga_{1-x2})_{y2}In_{1-y2}N$ i-layer 6. The AlN layer 2 has a 500 Å thickness. The GaN n$^+$-layer 3 has about a 2.0 μm thickness and a $2\times10^{18}$/cm$^3$ electron concentration. The n$^+$-layer 4 has about a 2.0 μm thickness and a $2\times10^{18}$/cm$^3$ electron concentration. A double i-layer structure is defined by the emission layer 5 and the i-layer 6. The emission layer 5 has about a 0.5 μm thickness, and the i-layer 6 has about a 0.5 μm thickness. Parts of the emission layer 5 and the i-layer 6 are p-type regions 50 and 60, respectively. Both of the p-type regions show or exhibit p-type conduction with $2\times10^{17}$/cm$^3$ hole concentration. The emission layer 5 and the i-layer 6, except for the p-type regions 50 and 60, exhibit semi-insulative characteristics. The claimed double i-layer structure corresponds to the emission layer 5 and the i-layer 6.

A silicon nitride (Si$_3$N$_4$) insulative film 21 is laminated on the i-layer 6 except for that area that will become the p-type region. Nickel electrodes 7 and 8 are connected to the p-type region 60 and the n$^+$-layer 4 of high carrier concentration, respectively.

The LED 10 is produced by gaseous phase growth, called metal organic vapor phase epitaxy referred to as MOVPE hereinafter.

The gases employed in this process are ammonia (NH$_3$), a carrier gas (H$_2$ or N$_2$), trimethyl gallium (Ga(CH$_3$)$_3$) (TMG hereinafter), trimethyl aluminum (Al (CH$_3$)$_3$) (TMA hereinafter), trimethyl indium (IN(CH$_3$)$_3$) (TMI hereinafter), diethylzinc ((C$_2$H$_5$)$_2$Zn) (DEZ hereinafter), silane (SiH$_4$) and biscyclopentadienyl magnesium (Mg (C$_5$H$_5$)$_2$) (CP$_2$Mg hereinafter).

The single crystalline sapphire substrate 1, whose main surface 'a' was cleaned by an organic washing solvent and heat treatment, was placed on a susceptor in a reaction chamber for the MOVPE treatment. Then the sapphire substrate 1 was etched at 1100° C. by a vapor of H$_2$ fed into the chamber at a flow rate of 2 liter/min. under normal pressure.

On the sapphire substrate 1, a 500 Å thick AlN buffer layer 2 was epitaxially formed on the surface 'a' under conditions of lowering the temperature in the chamber to 400° C., keeping the temperature constant and supplying H$_2$, NH$_3$, and TMA at a flow rate of 20 liter/min., 10 liter/min., and $1.8\times10^{-5}$ mol/min., respectively. On the buffer layer 2, an about 2.2 μm thick Si-doped GaN n$^+$-layer 3 of high carrier concentration with electron concentration of $2\times10^{18}$/cm$^3$ was formed under conditions of keeping the temperature of the sapphire substrate 1 at 1150° C. and supplying H$_2$, NH$_3$, TMG and silane diluted to 0.86 ppm by H$_2$ for thirty minutes at a flow rate of 20 liter/min., 10 liter/min., $1.7\times10^{-4}$ mol/min. and 200 ml/min., respectively.

The following manufacturing process provides for an emission layer 5 as an active layer, an n$^+$-layer 4 of high carrier concentration and an i-layer 6 as clad layers; the LED is designed to have 500 nm wavelength at peak in the luminous spectrum and have luminous centers of Zn.

On the n$^+$-layer 3, an about 2.0 μm thick Si doped (Al$_{0.3}$Ga$_{0.7}$)$_{0.94}$In$_{0.06}$N n$^+$-layer 4 of high carrier concentration with an electron concentration of $2\times10^{18}$/cm$^3$ was formed under conditions of keeping the temperature of the sapphire substrate 1 at 800° C. and supplying N$_2$, NH$_3$, TMG, TMA, TMI, and silane for 200 minutes at a flow rate of 20 liter/min., 10 liter/min., $1.12\times10^{-4}$ mol/min., $0.47\times10^{-4}$ mol/min., $0.1\times10^{-4}$ mol/min. and 50 mol/min., respectively.

On the n$^+$-layer 4, an about 0.5 μm thick Mg and Zn doped (Al$_{0.09}$Ga$_{0.91}$)$_{0.99}$In$_{0.01}$N emission layer 5 was formed under conditions of keeping the temperature of the sapphire substrate 1 at 1150° C. and supplying N$_2$, NH$_3$, TMG, TMA, TMI, CP$_2$Mg and DEZ for seven min. at a flow rate of 20 liter/min., 10 liter/min., $1.53\times10^{-4}$ mol/min., $0.47\times10^{-4}$ mol/min., $0.02\times10^{-4}$ mol/min., $2\times10^{-7}$ mol/min. and $2\times10^{-4}$ mol/min., respectively. At this stage, the resistivity of the emission layer 5 was $10^8$ Ω.cm or more remaining insulative. The impurity concentrations of Mg and Zn doped into the emission layer 5 were $2\times10^{19}$/cm$^3$ and $5\times10^{18}$ cm$^3$, respectively.

Figure 2:
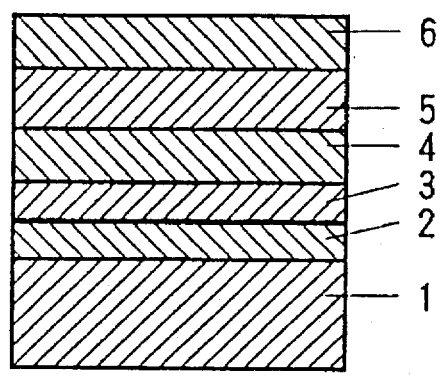
FIGS. 2 through 9 are sectional views illustrating successive steps of producing the LED embodied in Example 1.

On the emission layer 5, an about 0.5 μm thick Mg doped (Al$_{0.3}$Ga$_{0.7}$)$_{0.94}$In$_{0.06}$N i-layer 6 was formed under conditions of keeping the temperature of the sapphire substrate 1 at 1100° C. and supplying N$_2$, NH$_3$, TMG, TMA, TMI and CP$_2$Mg for 50 minutes at a flow rate of 20 liter/min., 10 liter/min., $1.12\times10^{-4}$ mol/min., $0.47\times10^{-4}$ mol/min., $0.1\times10^{-4}$ mol/min. and $2\times10^{-6}$ mol/min., respectively. Resistivity of the so-formed i-layer 6 was $10^8$ Ω.cm or more remaining insulative. The impurity concentration of the Mg doped into the i-layer 6 was $1\times10^{20}$/cm$^3$. Thereby, a wafer with multi-structural layers was obtained as shown in FIG. 2.

Figure 3:
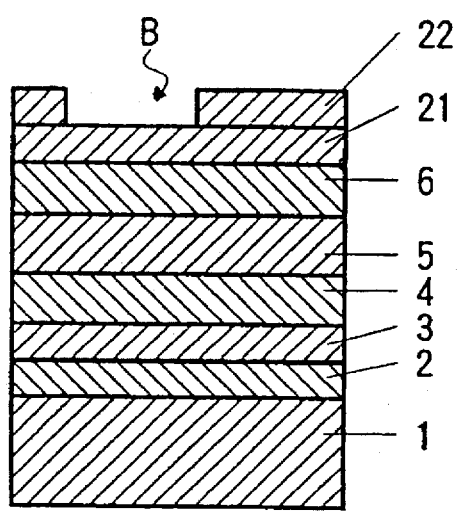
Figure 4:
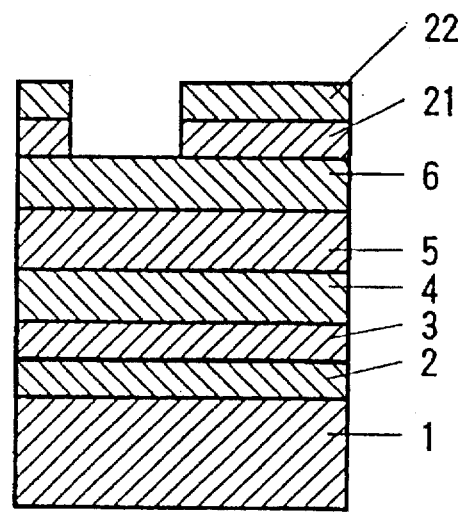

Then, a 2000 Å thick silicon nitride (Si$_3$N$_4$) insulative film 21 was formed on the i-layer 6 by sputtering. The insulative film 21 was coated with a photoresist layer 22. A selected part or area, named B, where p-type regions 60 and 50 are to be formed, was removed from the insulative layer 22 by photolithography as shown in FIG. 3. A part of the underlying Si$_3$N$_4$ insulative layer 21 which was not covered with the photoresist layer 22 was etched by an etching liquid such as hydrofluoric acid as shown in FIG. 4. The remaining photoresist layer 22 was then removed. Thereby, the Si$_3$N$_4$ insulative film 21 was obtained which covered the i-layer 6 except for the areas or parts which are subsequently processed to become the p-type regions 60 and 50.

Next, the chamber was heated at 600° to 900° C. and cooled down gradually, being filled with nitrogen gas for 5 to 30 min. As a result, the area or part of the Mg doped i-layer 6 and the emission layer 5 which were not covered with the Si$_3$N$_4$ insulative film 21 are processed to exhibit p-type conduction. This phenomenon is expected in that hydrogen combined with Mg is released outside of the crystalline structure. Thus, by this process, the respective p-type regions 60 and 50 are turned into semiconductors with p-type conduction characteristics whose hole concentration is $2\times10^{17}$/cm$^3$ and resistivity is 2 Ω.cm. The rest of the emission layer 5 and the i-layer 6 remained semi-insulative.

Figure 5:
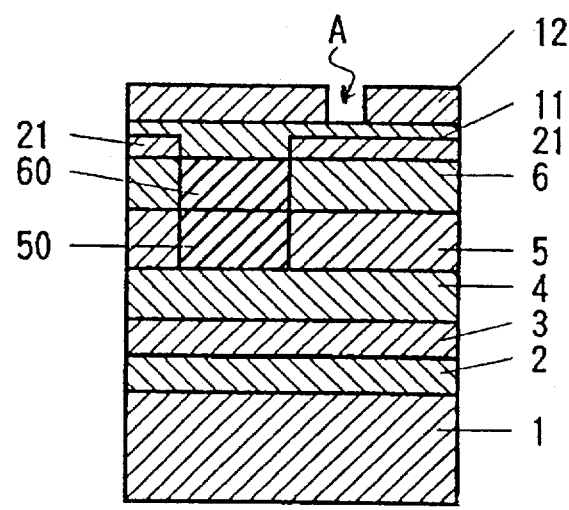
Figure 7:
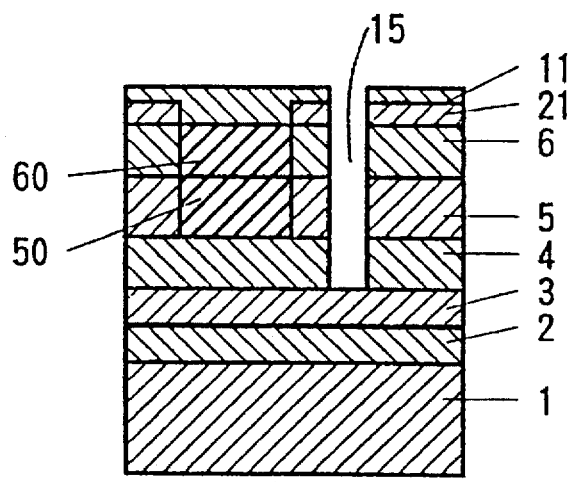

A 2000 Å thick SiO$_2$ layer 11 was formed by sputtering on the i-layer and the insulative film 21 as shown in FIG. 5. A photoresist layer 12 coated the SiO$_2$ layer 11. A part or area of the photoresist layer 12, named A, was removed by photolithography. The part A is an electrode forming part corresponding to a place where a hole 15, shown in FIG. 7, is formed extending to and into the n$^+$-layer 4 of high carrier concentration.

Figure 6:
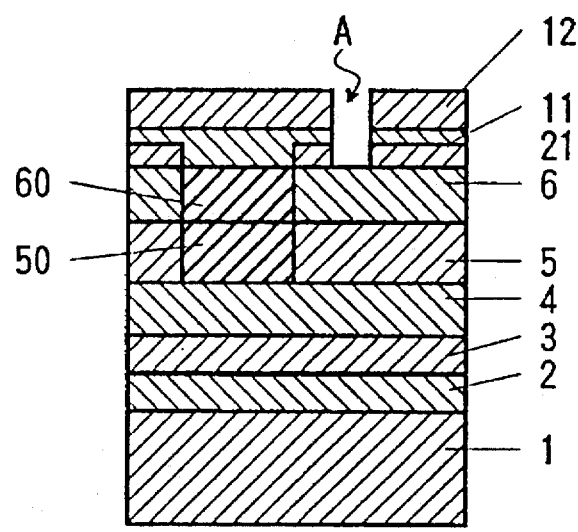

Parts of the SiO$_2$ layer 11 and the insulative film 21 which were not covered with the photoresist 12 was etched off by an etching liquid such as hydrofluoric acid as shown in FIG. 6. Then, the exposed part of the following successive three layers from the surface of the device, the i-layer, the emission layer 5, the n$^+$-layer 4 of high carrier concentration, were removed by dry etching, or supplying a high-frequency power density of 0.44 W/cm$^2$ and BCl$_3$ gas of 10 ml/min. at a vacuum degree of 0.04 Torr as shown in FIG. 7. After that, dry etching with argon (Ar) was carried out on the device.

Thus, a hole 15 for forming an electrode reaching the n+-layer 4 of high carrier concentration was formed.

Figure 8:
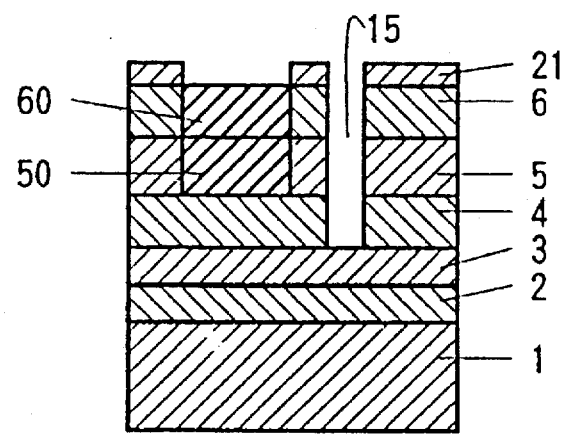
Figure 9:
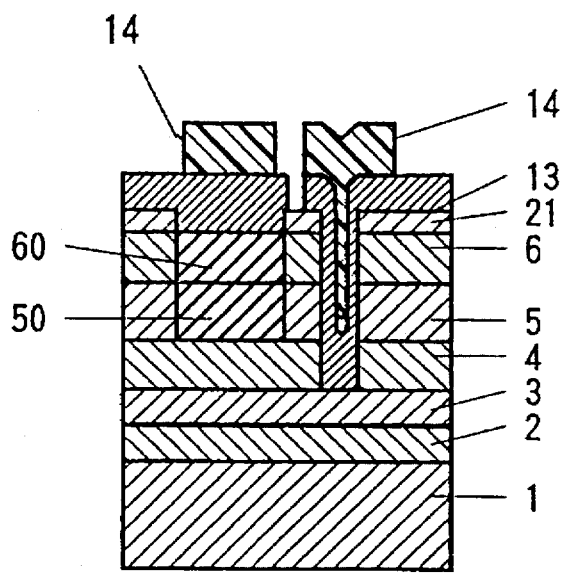

The $SiO_2$ layer 11 remaining on the i-layer 6 was removed by hydrofluoric acid as shown in FIG. 8. A nickel (Ni) layer 13 was laminated on the entire surface of the device by vapor deposition as shown in FIG. 9. Thus, the Ni layer 13 in the hole 15 electrically contacting the n+-layer 4 of high carrier concentration was formed. A photoresist 14 was laminated on the Ni layer 13 and, then, was etched off by photolithography leaving patterns of configuration for electrodes connected to the n+-layer 4 of high carrier concentration and the p-type region 60, respectively.

Using the photoresist 14 as a mask, the exposed part or area of the Ni layer 13 from the photoresist 14 was etched off by an etching liquid such as nitric acid. Then, the photoresist layer 14 was completely removed by a photoresist removal liquid such as acetone. Two electrodes, the electrode 8 for the n+-layer 4 of high carrier concentration and the electrode 7 for the p-type region 60, were formed. A wafer treated with the above-mentioned process was divided or "diced" into each element which shows a gallium nitride light-emitting diode with a p-n structure as shown in FIG. 1.

The obtained LED 10 was found to have a luminous intensity of 100 mcd and a wavelength of 420 nm by driving current of 20 mA.

The emission layer 5 preferably contains an impurity concentration of Mg and Zn within a range of $1\times10^{17}/cm^3$ to $1\times10^{20}/cm^3$, respectively, in order to improve luminous intensity.

Annealing was used to change parts of the i-layer and the emission layer 5 into p-type regions to have p-type conduction in this embodiment. Alternatively, a combination of annealing and electron irradiation can be used for that purpose.

EXAMPLE 2

Figure 10:
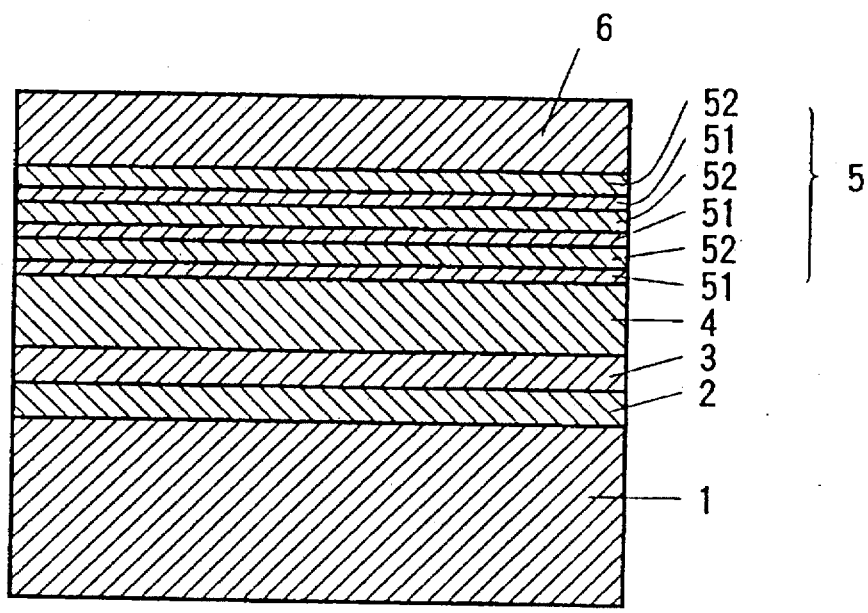
FIG. 10 is a diagram showing the multi-layer structure embodied in Example 2.

FIG. 10 shows a multi-layer structure utilized in Example 2. An emission layer 5 of the LED has a multi thin film structure. A Mg-doped film 51 and a Zn-doped film 52 are formed alternately. Thickness of the films 51 and 52 is 0.05 µm, respectively.

A manufacturing process of a sapphire substrate 1, the formation of the AlN buffer layer 2 and the n+-layers 3 and 4 was similar to that discussed in the previous example. The composite multi structural emission layer 5 was formed on the n+-layer 4 of high carrier concentration by the following process.

An about 0.05 µm thick $(Al_{0.09}Ga_{0.91})_{0.99}In_{0.01}N$ Mg doped thin film 51 was formed on the n+-layer 4 under conditions of lowering the temperature in the chamber to 1150° C., keeping it constant and supplying $N_2$, $NH_3$, TMG, TMA, TMI and $CP_2Mg$ for 5 minutes at a flow rate of 20 liter/min., 10 liter/min., $1.53\times10^{-4}$ mol/min., $0.47\times10^{-4}$ mol/min., $0.02\times10^{-4}$ mol/min. and $2\times10^{-7}$ mol/min., respectively.

An about 0.05 µm thick $(Al_{0.09}Ga_{0.91})_{0.99}In_{0.01}N$ Zn doped thin film 52 was formed on the thin film 51 under conditions of lowering the temperature in the chamber to 850° C., keeping it constant and supplying $N_2$, $NH_3$, TMG, TMA, TMI and DEZ for 20 minutes at a flow rate of 20 liter/min., 10 liter/min., $1.53\times10^{-4}$ mol/min., $0.47\times10^{-4}$ mol/min., $0.02\times10^{-4}$ mol/min. and $3\times10^{-4}$ mol/min., respectively.

The above process of manufacturing the films 51 and 52 as a set was repeated three times. Namely, the emission layer 5 consists of a six-layer film consequent to the Mg doped film 51 and the Zn doped film 52 being manufactured alternately three times. A p-layer 6 was formed on the top of the emission layer 5 by the similar process to that discussed in detail in the previous example. The p-layer 6 and the emission layer 5 were processed to have p-type conduction by annealing as described in Example 1. The subsequent process steps of forming the electrodes is the same as that described in the previous example.

EXAMPLE 3

Figure 11:
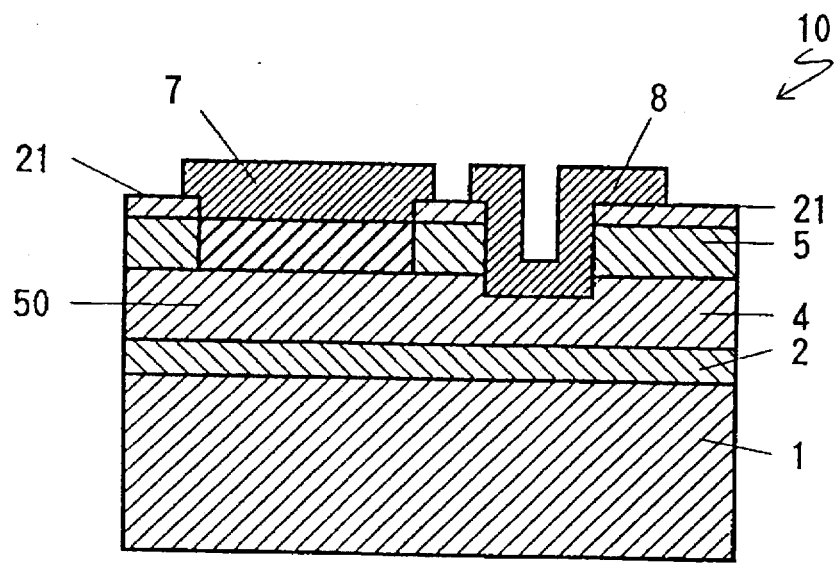
FIG. 11 is a diagram showing the structure of the LED embodied in Example 3.

FIG. 11 shows a structural view of a LED 10 embodied in Example 3. An n+-layer 4 of high carrier concentration and an emission layer 5 of this LED 10 are made of GaN. The n+-layer 4 is doped with Si. Its carrier concentration is $2\times10^{18}/cm^3$ and its thickness is 2.2 µm. The emission layer 5 is doped with Mg. Its carrier concentration is $5\times10^{18}/cm^3$. A part of this emission layer 5, or a region 50, comes to show p-type conduction by the annealing process as described in detail in Example 1. The subsequent process steps of forming the electrodes is the same as that described in Example 1.

EXAMPLE 4

Figure 12:
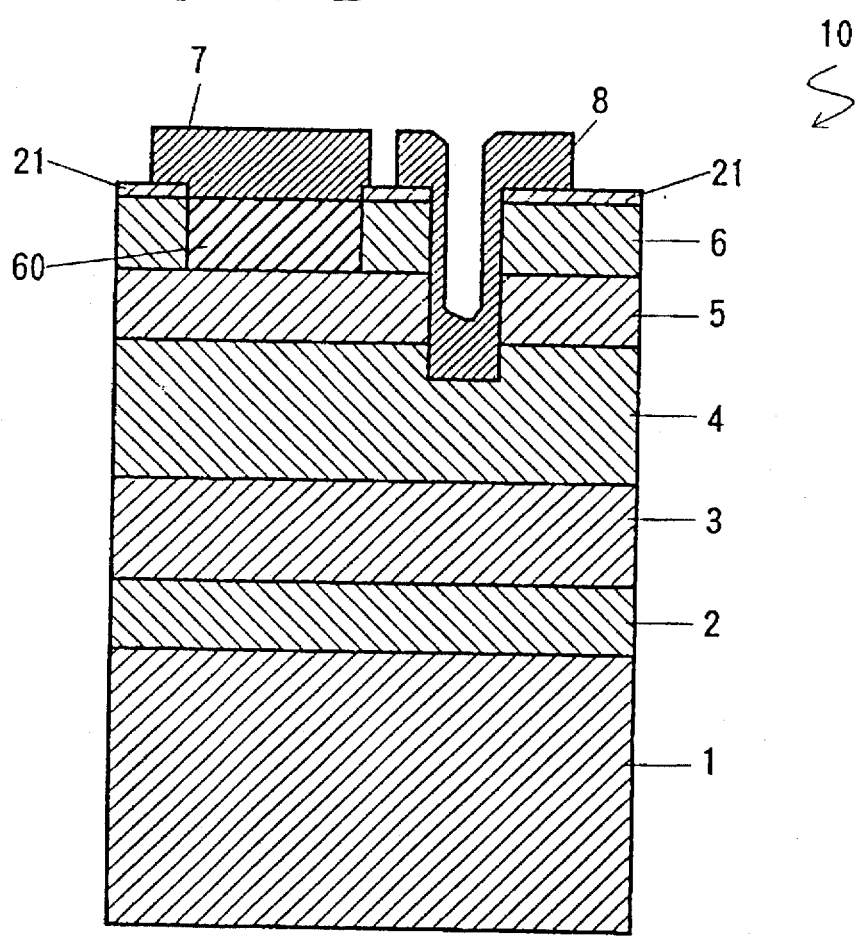
FIG. 12 is a diagram showing the structure of the LED embodied in Example 4.

FIG. 12 shows a structural view of a LED 10 embodied in Example 4. In this example, cadmium (Cd) and Si are doped into an emission layer 5. An i-layer 6 is doped with Mg. Concentration of Cd doped to the emission layer 5 is $2\times10^{18}/cm^3$ and that of Si is $1\times10^{18}/cm^3$. Alternatively, Zn and Si can be doped to the emission layer 5. In this case, preferable impurity concentration of Zn is $5\times10^{18}/cm^3$ and that of Si is $1\times10^{18}/cm^3$.

The LED 10 in this example is manufactured by the same process described in detail in Example 1. Exceptionally, the emission layer 5 of this example remained semi-insulative, because Mg was not doped thereto. Thus, only an i-layer 6 has a p-type region 60 in this example.

In order to make the band or forbidden gap of the emission layer 5 smaller than those of its respective adjacent two layers, the i-layer 6 and the n+-layer 4 of high carrier concentration, a double hereto junction structure is utilized in the LED 10 shown in Examples 1, 2 and 4. Alternatively, a single hetero junction structure can be utilized.

Further, composition ratio of Al, Ga, In and N in the three layers is selectively decided to meet the lattice constant of GaN in the n+-layer 3 of high carrier concentration.

In the case where a LED designed to emit light with a 420 nm wavelength at peak is manufactured, the composition equation of the two layers, the n+-layer 4 and the i-layer 6, and that of the emission layer 5 are $Al_{0.36}Ga_{0.56}In_{0.08}N$ and $Al_{0.36}Ga_{0.56}In_{0.08}N$, respectively. In the case where a LED designed to emit light with a 520 nm wavelength at peak is manufactured, the composition equation of the two layers, the n+-layer 4 and the i-layer 6, and that of the emission layer 5 are $Al_{0.004}Ga_{0.091}In_{0.905}N$ and $Al_{0.36}Ga_{0.56}In_{0.08}N$, respectively.

EXAMPLE 5

Figure 13:
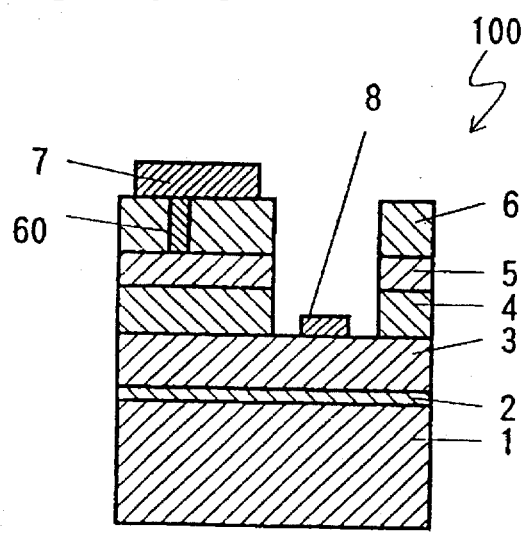
FIG. 13 is a diagram showing the structure of the LED embodied in Example 5.

FIG. 13 shows a LED 100 embodied in Example 5. It has a sapphire substrate 1 upon which the following five layers are consecutively formed: an AlN buffer layer 2; a Si doped GaN n+-layer 3 of high carrier (n-type) concentration; a Si doped $(Al_{x2}Ga_{1-x2})_{y2}In_{1-y2}N$ n+-layer 4 of high carrier (n-type) concentration; an $(Al_{x1}Ga_{1-x1})_{y1}In_{1-y1}N$ emission layer 5 without any dopants; and Mg doped $(Al_{x2}Ga_{1-x2})_{y2}$ $In_{1-y2}N$ i-layer 6. The AlN layer 2 has 500 Å thickness. The GaN $n^+$-layer 3 has about a 2.0 μm thickness and a $2\times10^{18}/cm^3$ electron concentration. The $n^+$-layer 4 has about a 2.0 μm thickness and a $2\times10^{18}/cm^3$ electron concentration. The emission layer 5 has about 0.5 μm thickness. The i-layer 6 has about 0.5 μm thickness. The i-layer 6 has a strip-shaped p-type region 60, which exhibits p-type conduction with a $2\times10^{17}/cm^3$ hole concentration. The i-layer 6, except for the p-type region 60, remains semi-insulative. The claimed i-layer structure corresponds to this i-layer 6.

A nickel electrode 7 is formed on the i-layer 6 and is connected to the p-type region 60. A nickel electrode 8 is formed on the $n^+$-layer 3 of high carrier concentration and is in contact therewith.

A LED 100 with the above-mentioned structure was produced by MOVPE. The gases employed in this process were $NH_3$, carrier gas ($H_2$ or $N_2$), TMG, TMA, TMI, DEZ, silane, and $CP_2Mg$.

The single crystalline sapphire substrate 1, whose main surface 'a' was cleaned by an organic washing solvent and heat treatment, was placed on a susceptor in a reaction chamber for the MOVPE treatment. Then the sapphire substrate 1 was etched at 1100° C. by a vapor of $H_2$ fed into the chamber at a flow rate of 2 liter/min. under normal pressure.

On the sapphire substrate 1, an about 500 Å thick AlN buffer layer 2 was formed under conditions of lowering the temperature in the chamber to 300° to 400° C., keeping the temperature constant, and supplying $H_2$, $NH_3$ and TMA for 2 minutes at a flow rate of 20 liter/min., 10 liter/min. and $1.8\times10^{-5}$ mol/min., respectively. On the buffer layer 2, an about 2.2 μm thick Si doped GaN $n^+$-layer 3 of high carrier concentration with electron concentration of $2\times10^{18}/cm^3$ was formed under conditions of keeping the temperature of the sapphire substrate 1 at 1000° C. and supplying $H_2$, $NH_3$, TMG and silane diluted to 0.86 ppm by $H_2$ for thirty minutes at a flow rate of 20 liter/min., 10 liter/min., $1.7\times10^{-4}$ mol/min. and 200 ml/min., respectively.

The manufacturing process described below presents an example which specifies the composition ratio and the growth conditions of an emission layer 5 as an active layer, an $n^+$-layer 4 of high carrier concentration, and an i-layer 6 as clad layers.

On the $n^+$-layer 3, an about 0.5 μm thick Si doped $(Al_{0.3}Ga_{0.7})_{0.94}In_{0.06}N$ $n^+$-layer 4 of high carrier concentration with an electron concentration of $2\times10^{18}/cm^3$ was formed under conditions of keeping the temperature of the sapphire substrate 1 at 1000° C. and supplying $N_2$, $NH_2$, TMG, TMA, TMI and silane for 50 minutes at a flow rate of 20 liter/min., 10 liter/min., $1.12\times10^{-4}$ mol/min., $0.47\times10^{-4}$ mol/min., $0.1\times10^{-4}$ mol/min. and 50 ml/min., respectively.

On the $n^+$-layer 4, an about 0.1 μm thick undoped $(Al_{0.09}Ga_{0.91})_{0.99}In_{0.01}N$ emission layer 5 was formed under conditions of keeping the temperature of the sapphire substrate 1 at 800° to 900° C. and supplying $N_2$, $NH_3$, TMG, TMA and TMI for 1.4 min. at a flow rate of 20 liter/min., 10 liter/min., $1.53\times10^{-4}$ mol/min., $0.47\times10^{-4}$ mol/min. and $0.02\times10^{-4}$ mol/min., respectively.

Figure 14:
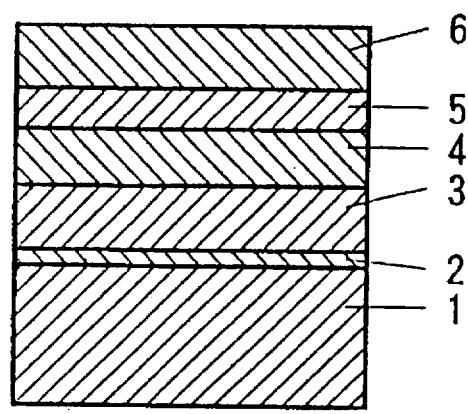
FIGS. 14 to 21 are sectional views illustrating successive steps of producing the LED embodied in Example 5.

On the emission layer 5, an about 1.0 μm thick Mg doped $(Al_{0.3}Ga_{0.7})_{0.94}In_{0.06}N$ i-layer 6 was formed under conditions of keeping the temperature of the sapphire substrate 1 at 1000° C. and supplying $N_2$, $NH_3$, TMG, TMA, TMI and $CP_2Mg$ for 100 minutes at a flow rate of 20 liter/min., 10 liter/min., $1.12\times10^{-4}$ mol/min., $0.47\times10^{-4}$ mol/min., $0.1\times10^{-4}$ mol/min. and $2\times10^{-6}$ mol/min., respectively. The i-layer 6 remained insulative with a resistivity of $10^3$ Ω.cm or more. This impurity concentration of the Mg doped in to the i-layer 6 was $1\times10^{20}/cm$. Thereby, a wafer of multi-structural layers was obtained as shown in FIG. 14.

Figure 15:
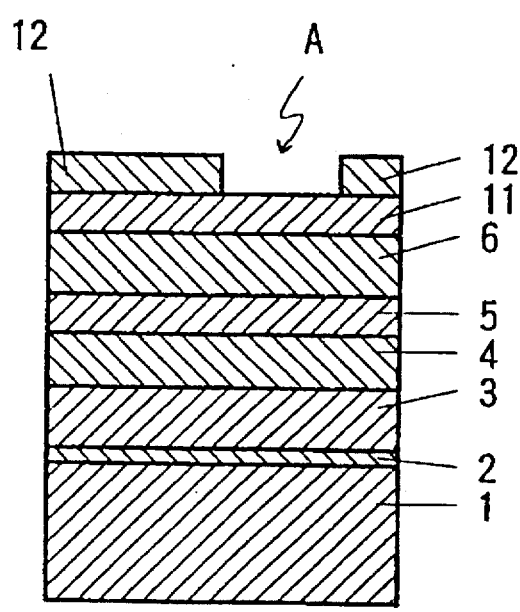

A 2000 Å thick $SiO_2$ layer 11 was formed by sputtering on the i-layer 6. A photoresist layer 12 coated the $SiO_2$ layer 11. A part or area of the photoresist layer 12, named A, was removed by photolithography as shown by FIG. 15. The part A was an electrode forming part corresponding to a place where a hole 15 shown in FIG. 17 would be formed reaching to the $n^+$-layer 4 of high carrier concentration.

Figure 16:
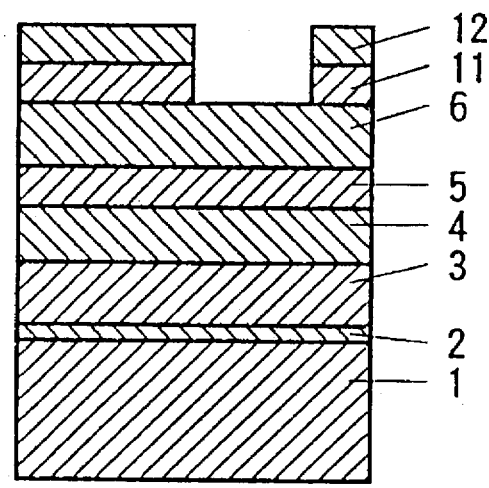
Figure 17:
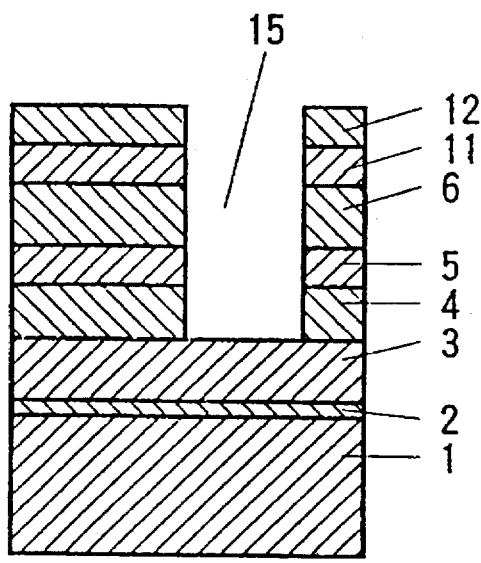

The part of the $SiO_2$ layer 11 which was not covered with photoresist 12 was etched of by an etching liquid such as hydrofluoric acid as shown in FIG. 16. Then, the exposed part of the following successive three layers from the surface of the device, the i-layer 6, the emission layer 5, the $n^+$-layer 4 of high carrier concentration, were removed by dry etching, or supplying a high-frequency power density of 0.44 $W/cm^2$ and $BCl_3$ gas of 10 ml/min. at a vacuum degree of 0.04 Torr as shown in FIG. 17. After that, dry etching with Ar was carried out on the device. Thus, a hole 15 for forming an electrode reaching the $n^+$-layer 3 of high carrier concentration was formed.

Figure 18:
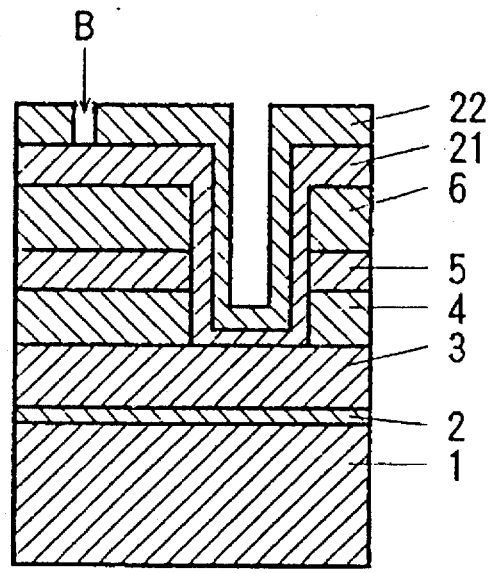
Figure 19:
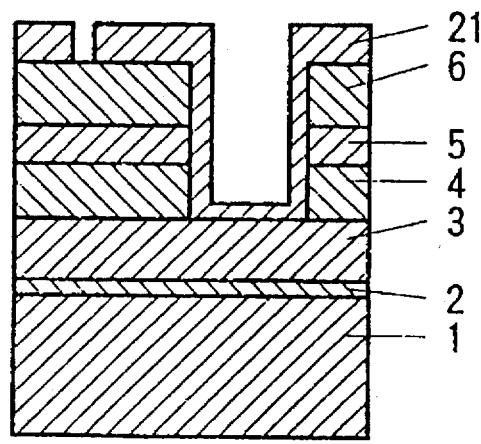

Then, a 2000 Å thick $Si_3N_4$ insulative film 21 was formed on the entire surface of the device by sputtering. The insulative film 21 was coated with a photoresist layer 22. A selected part or area, named B, where a strip-form p-type region 60 would be formed, was removed from the insulative layer 22 by photolithography as shown in FIG. 18. The $Si_3N_4$ insulative layer 21 which was not covered with the photoresist layer 22 was etched by an etching liquid such as hydrofluoric acid as shown in FIG. 19. The remaining photoresist layer 22 was removed. Thereby, a $Si_3N_4$ insulative film 21 was obtained which covers the i-layer 6, except the or area part B.

Next, the chamber was heated at 600° to 900° C. and cooled down gradually, being filled with nitrogen gas for 5 to 30 min. As a result, the part of the Mg doped i-layer 6 which was not covered with $Si_3N_4$ insulative film 21 came to exhibit p-type conduction. This phenomenon is expected in that hydrogen combined with Mg is released outside of the crystalline structure. Thus, by this process, the p-type region 60 is turned into semiconductors with p-type conduction whose hole concentration is $2\times10^{17}/cm^3$ and resistivity is 2 Ω.cm. The rest of the i-layer 6 remained semi-insulative.

Figure 20:
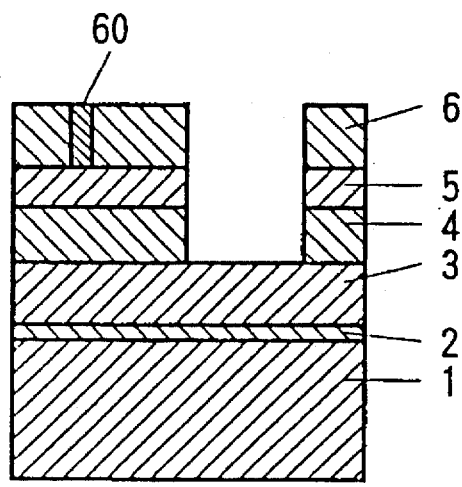
Figure 21:
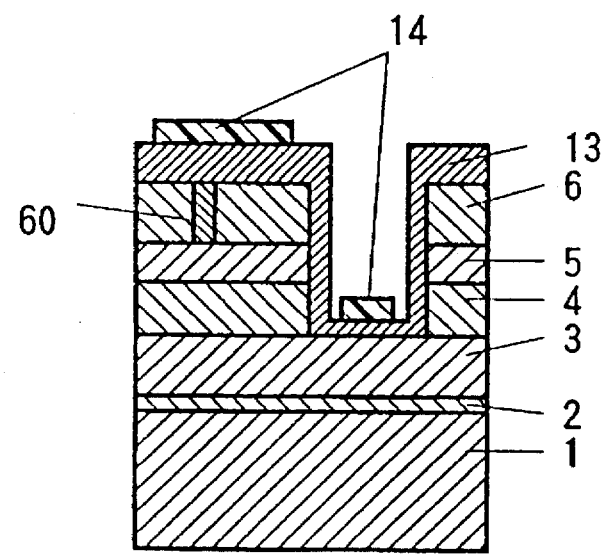

The $Si_3N_4$ layer 21 remaining on the i-layer 6 was removed by hydrofluoric acid as shown in FIG. 20. A Ni layer 13 was laminated on the entire surface of the device by vapor deposition. Thus, the Ni layer 13 in the hole 15 electrically contacting the $n^+$-layer 4 of high carrier concentration was formed. A photoresist 14 was laminated on the Ni layer 13 as shown in FIG. 21 and, then, was etched off by photolithography leaving patterns of configuration for the electrodes connected to the $n^+$-layer 4 of high carrier concentration and the p-type region 60, respectively.

Using the photoresist 14 as a mask, the exposed part of the Ni layer 13 from the photoresist 14 was etched off by an etching liquid such as nitric acid. Then, the photoresist layer 14 was completely removed by a photoresist removal liquid such as acetone. Two electrodes, the electrode 8 for the $n^+$-layer 4 of high carrier concentration and the electrode 7 for the p-type region 60, were formed. A wafer treated with the above-mentioned process was divided into each element which shows a gallium nitride light-emitting diode with a p-i-n structure as shown in FIG. 13.

The obtained LED 100 was found to have an output power of 1 mW and an oscillation wavelength of 340 nm by driving current of 20 mA.

Alternatively, this method described in Example 5 can be applied to produce a laser diode.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method of producing a light-emitting semiconductor device comprising the steps of:

growing an n-layer of n-type group III nitride compound semiconductor satisfying the formula $Al_{x1}Ga_{y1}In_{1-x1-y1}N$ wherein $0 \leq x1 \leq 1$, $0 \leq y1 \leq 1$, and $0 \leq x1+y1 \leq 1$;

growing an i-layer of semi-insulating group III nitride compound semiconductor satisfying the formula $Al_{x2}Ga_{y2}In_{1-x2-y2}N$ wherein $0 \leq x2 \leq 1$, $0 \leq y2 \leq 1$, and $0 \leq x2+y2 \leq 1$ formed on said n-layer, said i-layer being doped with a p-type impurity;

covering said i-layer with an insulating film except for a selected region thereof; and annealing said device in a nitrogen atmosphere after covering said i-layer with said insulating film so that said selected region of said i-layer acquires p-type conduction.

2. A method of producing a light-emitting semiconductor device of claims 1, wherein said insulating film is made of $Si_3N_4$.

3. A method of producing a light-emitting semiconductor device of claim 1, wherein the annealing temperature is 600° to 900° C.

4. A method of producing a light-emitting semiconductor device of claim 1, wherein said i-layer comprises two sub-layers having p-type regions each partially processed to have p-type conduction, one of said sub-layers being formed on said n-layer and is an emission layer having an emission region with a luminous center.

5. A method of producing a light-emitting semiconductor device of claim 4, wherein said emission layer is doped with magnesium (Mg) and zinc (Zn), the other one of said sub-layers being formed on said emission layer and being doped with magnesium.

6. A method of producing a light-emitting semiconductor device of claim 4, wherein said emission layer is doped with silicon (Si) and one of zinc (Zn), cadmium (Cd), and magnesium (Mg).

7. A method of producing a light-emitting semiconductor device of claim 4, wherein said emission layer is a multi-layer structure comprising two kinds of layers alternately formed, one of said two kinds of layers being doped with magnesium (Mg) and another of said two kinds of layers being doped with zinc (Zn).

8. A method of producing a light-emitting semiconductor device of claim 4, wherein said emission layer contains magnesium (Mg) and zinc (Zn), each having a concentration in the range of $1 \times 10^{17}/cm^3$ to $1 \times 10^{20}/cm^3$.

9. A method of producing a light-emitting semiconductor device of claim 4, wherein said emission layer contains silicon (Si) and zinc (Zn) impurities, each having a concentration in the range of $1 \times 10^{17}/cm^3$ to $1 \times 10^{20}/cm^3$.

10. A method according to claim 1, wherein said step of annealing is performed after said step of covering.

* * * * *